United States Patent [19]
Wang

[11] Patent Number: 5,879,987
[45] Date of Patent: Mar. 9, 1999

[54] METHOD OF FABRICATING DYNAMIC RANDOM ACCESS MEMORY HAVING A STACKED CAPACITOR

[76] Inventor: Chuan-Fu Wang, 3F, No. 5, Lane 397, Jen-Ai St., Sanchung City, Taipei Hsien, Taiwan

[21] Appl. No.: 79,253

[22] Filed: May 14, 1998

[30] Foreign Application Priority Data

Feb. 21, 1998 [TW] Taiwan ................................. 87102476

[51] Int. Cl.$^6$ .............................................. H01L 21/8242
[52] U.S. Cl. ............................................ 438/253; 438/254
[58] Field of Search .................................. 438/253–256, 438/390–399

[56] References Cited

U.S. PATENT DOCUMENTS

5,217,914 6/1993 Matsumoto et al. .
5,716,884 2/1998 Hsue et al. .

Primary Examiner—Jey Tsai
Attorney, Agent, or Firm—Thomas, Kayden, Horstemeyer & Risley, L.L.P.

[57] ABSTRACT

A structure of a capacitor in a DRAM includes: A dielectric layer with a contact window for later connecting use is formed on a substrate. Then, a first-conductive layer is formed over the dielectric and is coupled to either the source or the drain of a TFET through the contact window. Subsequently, a number of insulating layers and second-conductive layers are superposed alternatively together to form a stacked layer. By using the space occupied by the insulating layers, a number of third-conductive layers replacing the inner portion of the insulating layers are formed in between the second-conductive layers. After removing the insulating layers between the second-conductive layers, a structure of a horn-like in a sectional view is formed. The first-conductive layer, the second-conductive layers and the third-conductive layers are coupled together to act as a lower electrode of the capacitor. Then, a dielectric thin film is formed over the lower electrode. And then, the fourth-conductive layer is formed over the dielectric thin film to act as an upper electrode.

22 Claims, 7 Drawing Sheets

METHOD OF FABRICATING DYNAMIC RANDOM ACCESS MEMORY HAVING A STACKED CAPACITOR

CROSS-REFERENCE TO RELATED APPLICATION

This application claims the priority benefit of Taiwan application Ser. No. 87102476, filed Feb. 21, 1998, the full disclosure of which is incorporated herein by reference.

BACKGROUND OF THE INVENTION

1. Field of the Invention

This invention relates in general to the structure and fabricating method of integrated circuit (IC), and more particularly, to the structure and fabricating method of a horn-like capacitor made by a stacked layer through a number of insulating and conductive layers alternatively superposed together in a dynamic random access memory (DRAM) device.

2. Description of Related Art

Figure 1:
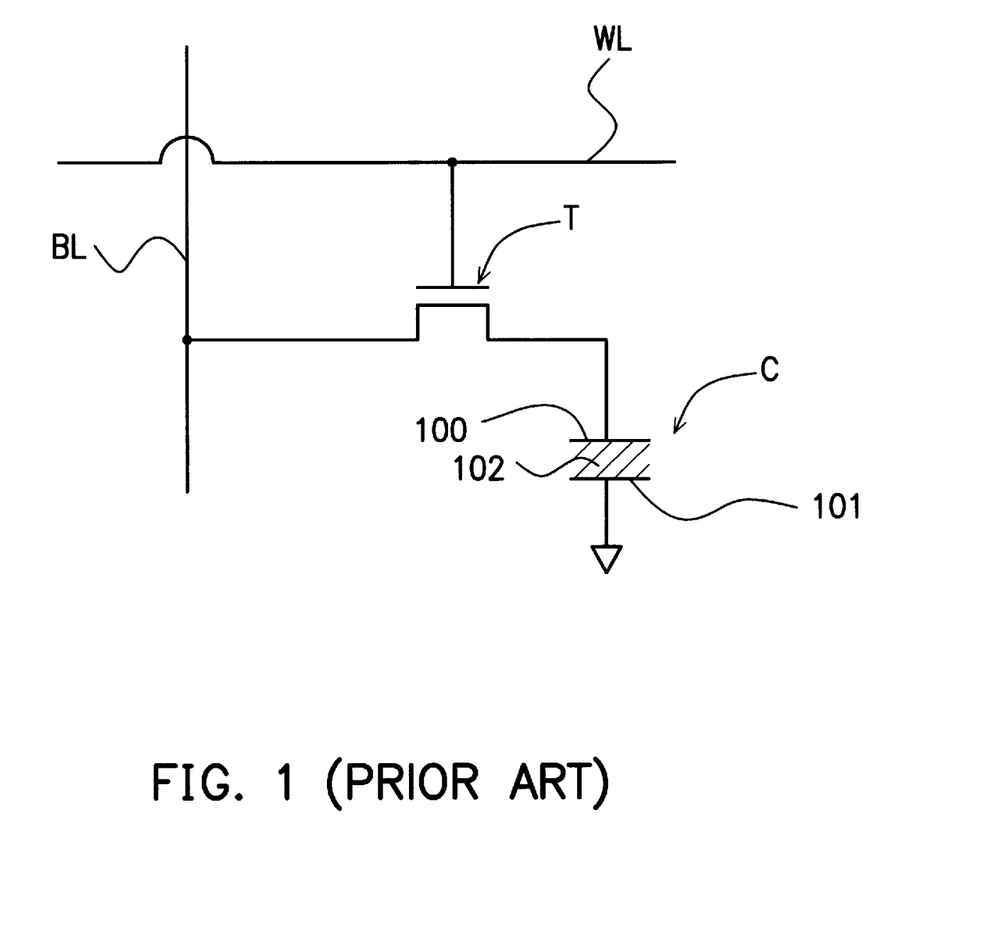
FIG. 1 is the configuration of circuit of a conventional DRAM device.

When the function of micro process is continuously enhanced and, in accordance with, the abilities of software including the program size and the computing power are increased, the capacitance of memory is enlarged accordingly. As the integration of DRAM is increased, the memory cell for the present development includes a transfer field effect transistor (TFET) and a storage capacitor. FIG. 1 is the configuration of the circuit of the memory cell in a DRAM device. In FIG. 1, the selected capacitor C, one of an array of capacitors built on the wafer, can be used to store the data by either charging or discharging the capacitor C. The most common way is that a binary data stored on a bit has a logic state of "0" as the capacitor C being discharged and has a logic state of "1" as the capacitor C being charged. In general, a dielectric thin film 102 is sandwiched between an upper electrode 100 and a lower electrode 101 of the capacitor C to provide the required dielectric constant. The capacitor C is coupled to a bit line BL and fulfills the action of read/write through charging or discharging the capacitor C by utilizing the TFET T as a switch. The action as described above is done by the following procedure that the TFET T is coupled between the bit line BL and the capacitor C through a source and a drain of the TFET T, respectively. The word line WL is coupled to the gate of TFET T to selectively control the connecting status between the bit line BL and capacitor C.

In the case of the capability of DRAM, which is less than the need for 1 Megabit in the fabricating process of an integrated circuit, the capacitance conventionally is obtained by utilizing a two dimensional capacitor, generally, called as the planar type capacitor. This kind of capacitor occupies a large area on a substrate to store the needed charges so that it is not a proper application for a high integration case. A highly integrated DRAM like one greater than 4 Megabit needs a capacitor with three dimensional structure, which has such as a stacked type or a trench type, to obtain the needed charges.

In comparison with the planar type capacitor, the stacked type or the trench type capacitor are still able to obtain a large quantity of capacitance even in the case that the size of the memory unit has been further reduced. Unfortunately a simple three dimensional structure of capacitor is no longer suited for the further highly integrated memory device having such as a DRAM with 64 Megabit.

As known by skilled persons on the fabrication of the capacitor as described above, the capacitance is decreased when the size of the memory cell has been reduced, and then the possibility of soft error is increasing due to the incident α ray on the memory cell, which has low capacitance.

One of the solutions is to extend the area of the electrode and the dielectric thin film of the capacitor horizontally and to stack them up as a type called fin type capacitor to enhance the capacitance by utilizing the increasing area size of the capacitor.

Another solution is to extend the area size of the electrode and the dielectric thin film of the capacitor vertically as a type called cylindrical type capacitor to enhance the capacitance by utilizing the increasing area size of the capacitor.

The size of a memory cell of a DRAM is continuously reduced as the integration ability is continuously increased. So, one in this field of fabricating capacitor is continuously looking for new structures and fabricating methods of the capacitor for use in semiconductor device to reduce the size but keep the capacitance.

SUMMARY OF THE INVENTION

It is therefore an object of the present invention to provide a structure and a fabricating method of a capacitor made in a stacked layer. The capacitor in a DRAM is composed of a number of insulating layers and conductive layers alternatively superposed together. According to above, it has the advantages that the effective area of the capacitor in the DRAM can be tremendously increased to enhance the capacity in a little area.

In accordance with the foregoing and other objectives of the present invention, the fabricating method of a capacitor in a DRAM includes: A dielectric layer with an open window for later connecting use is formed on a substrate. Then, a conductive layer is formed over the dielectric layer and connected to either the source or the drain of the TFET through the open window. Subsequently, a number of insulating layers and a number of second-conductive layers are superposed alternatively together to become a stacked layer. By using the space occupied by the insulating layer, a number of third-conductive layers replacing the portion of the insulating layer in the middle is formed in between the second-conductive layer. After removing the residual of the insulating layers between the second-conductive layers, a horn-like lower electrode of the capacitor is formed.

This horn-like lower electrode of the capacitor is electrically coupled to either the source or the drain of the TFET which has been formed on the substrate. Then, a dielectric thin film is formed over the surface of the second and the third-conductive layer. Then, the fourth-conductive layer is formed over the dielectric thin film to act as an upper capacitor plate of the capacitor.

BRIEF DESCRIPTION OF THE DRAWINGS

The invention can be more fully understood by reading the following detailed description of the preferred embodiment, with reference made to the accompanying drawings, wherein.

DETAILED DESCRIPTION OF THE PREFERRED EMBODIMENT

Figure 2A:
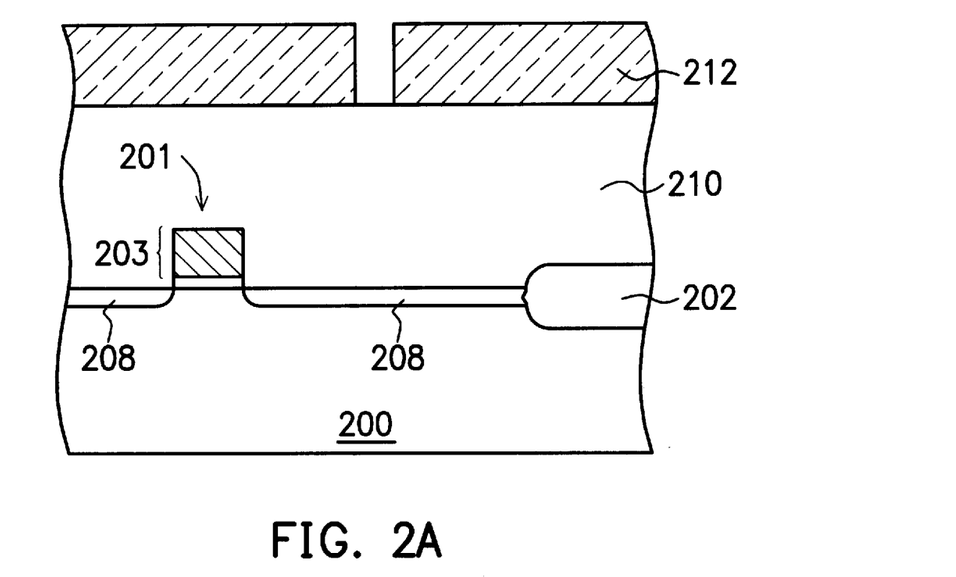
FIG. 2A through 2L are the schematic sectional diagrams of the structure of the capacitor in the DRAM to depict the steps involved in the fabricating method according to the preferred embodiment of the invention.

As shown in FIG. 2A, a TFET 201 used in a DRAM is formed on the substrate 200, such as p type silicon substrate.

This TFET 201 includes an interchangeable source/drain region 208 and a gate 203 on the active area of the substrate. The gate 203 is insulated by a field oxide layer 202. Subsequently, a dielectric layer 210, such as made of silicon dioxide or BoronPhosphoSilicate Glass (BPSG) and by a method of chemical vapor deposition (CVD), is formed over the substrate 200. Then, a layer of photoresist 212 is formed to define the well for later use.

Figure 2B:
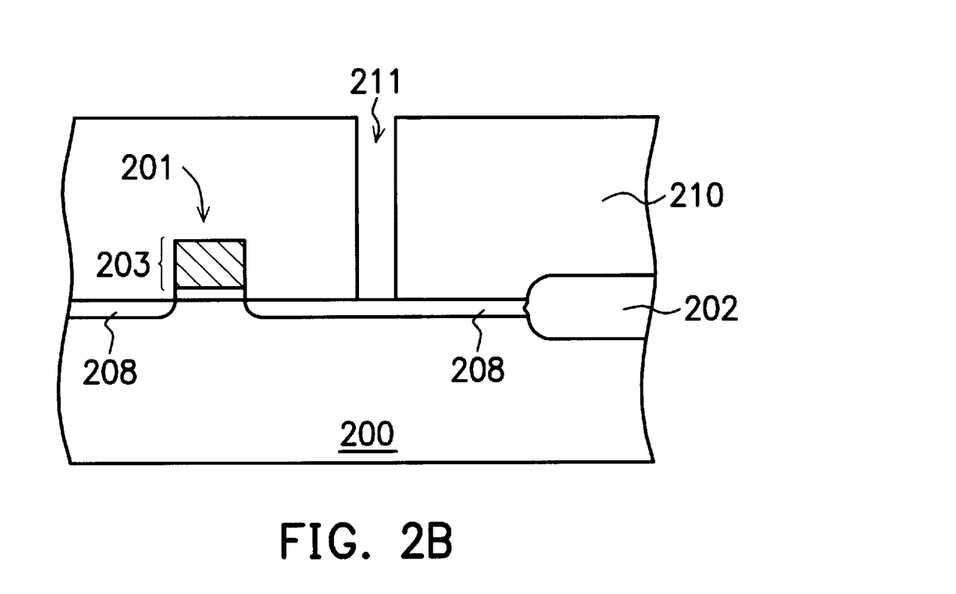

As shown in FIG. 2B, by a technology of photolithography etching a contact window 211 defined by photoresist 212 is formed to let the interchangeable source/drain region 208 of TFET 201 be exposed at this step. The etching method includes an anisotropic etching.

Figure 2C:
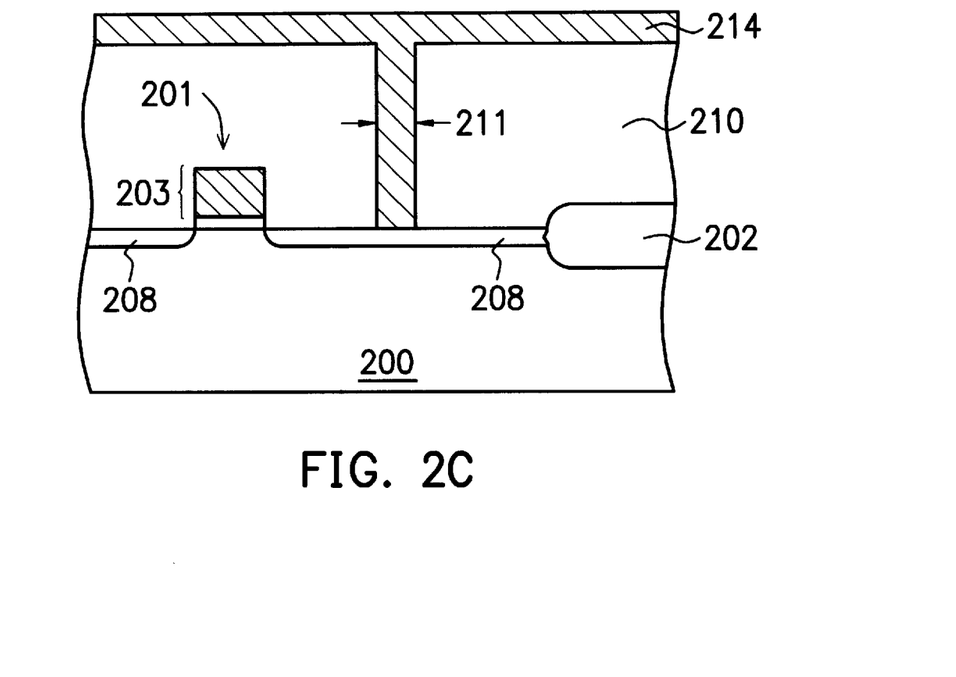

As shown in FIG. 2C, a conductive layer 214, that is, a first-conductive layer, is formed over the dielectric layer 210 and occupies the contact window 211 either. The formation of the conductive layer 214 is preferred to take the method of CVD and to be made of doped polysilicon.

Figure 2D:
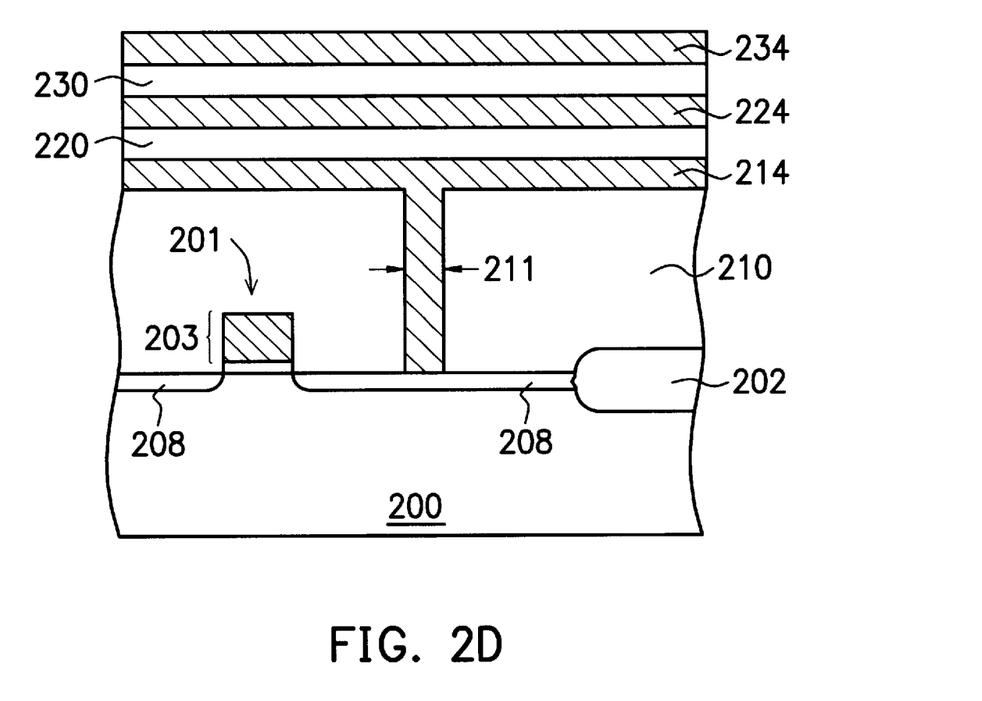

As shown in FIG. 2D, a number of insulating layers and conductive layers alternatively superposed together are formed over the conductive layer 214. It is done subsequently starting from an insulating layer 220, a conductive layer 224, an insulating layer 230 and ending on a conductive layer 234 called as the stacked layer for all together. Within, the insulating layer 220 and 230 can be made of one such as BPSG through the method of atmospheric CVD (APCVD) or TEOS silicon oxide through the method of APCVD using TEOS Tetra-Ethyl-Ortho-Silicate (TEOS) as the reaction gas. The conductive layer 224 and the conductive layer 234, called together as a second-conductive layer, are made of doped polysilicon through the method of CVD.

Figure 2E:
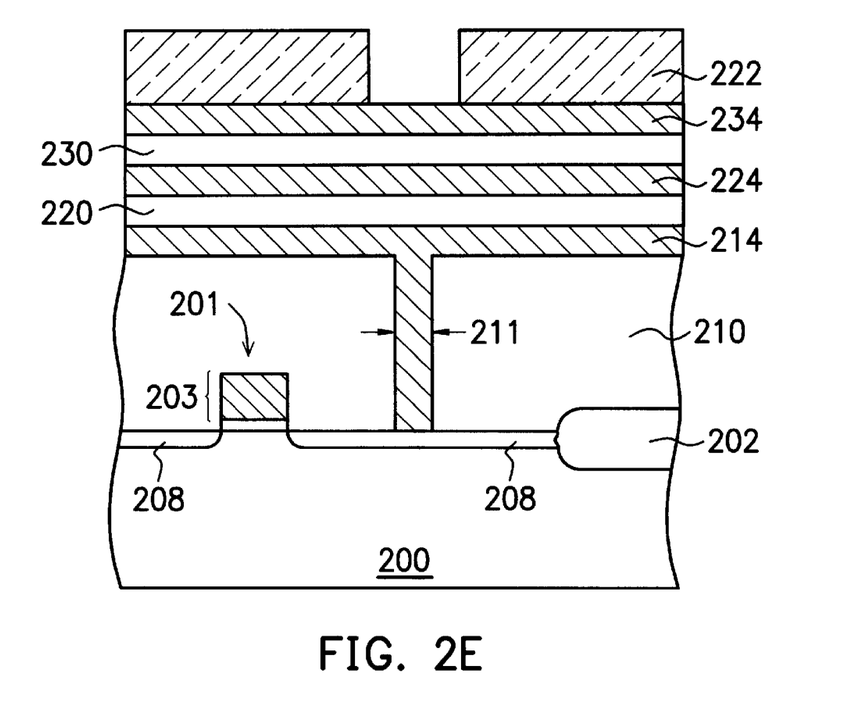

As shown in FIG. 2E, a layer of photoresist 222 is formed over the stacked layer and let a portion of the conductive layer 234 be exposed.

Figure 2F:
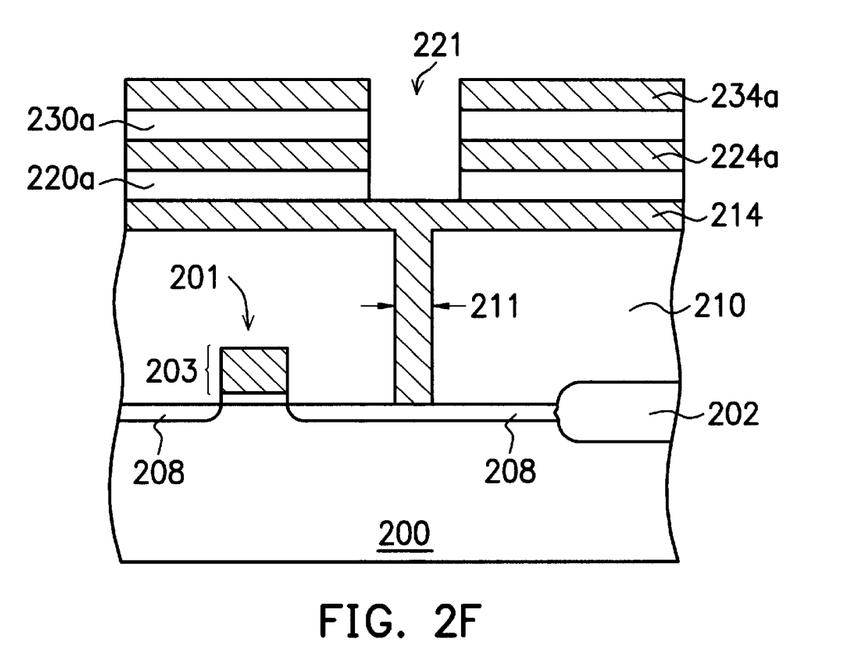

As shown in FIG. 2F, by the technology of photolithography etching an opening 221 defined by photoresist 222 is formed down to the upper surface of the conductive layer 214 just right above the contact window 211. Therefore, the stacked layer is separated into two portions as a conductive layer of 220a, a conductive layer of 230a, an insulating layer of 224a and an insulating layer of 234a.

Figure 2G:
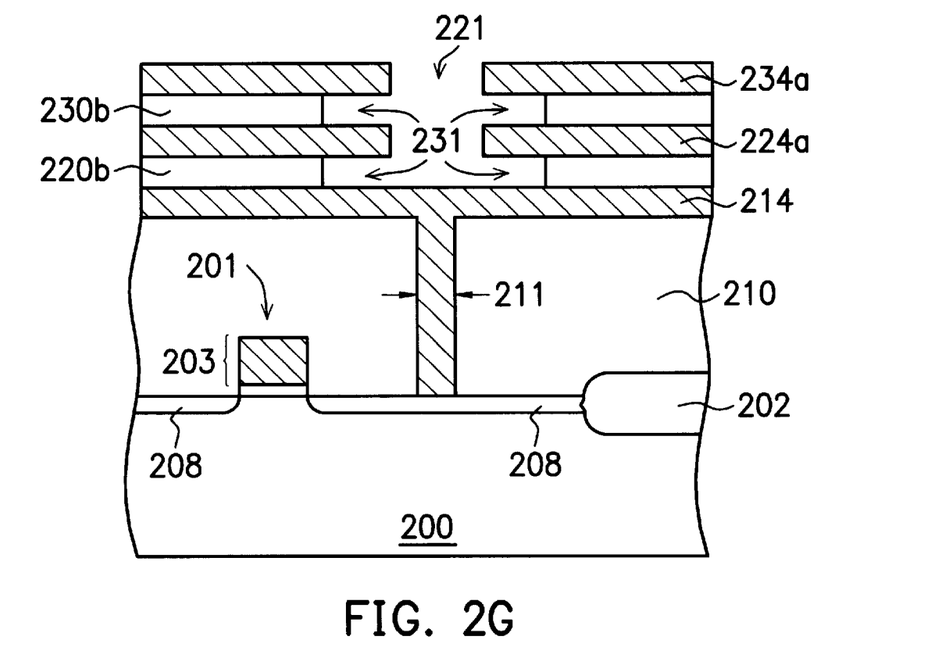

As shown in FIG. 2F and FIG. 2G, by removing a portion of the insulating layers 220a and 230a as indicated by an indented void 231, the insulating layers 220a, 230a become the insulating layers 220b, 230b. This is one of the characteristics of this present invention. To obtain the indented void 231, a method of isotropic etching is preferred to be taken including the use of attenuated hydrofluoric acid solution or buffer oxide etchant (BOE) to remove a portion of the insulating layers 220a, 230a, which includes BPSG or TEOS silicon oxide. So, the indented void 231 is exposed at this step.

Figure 2H:
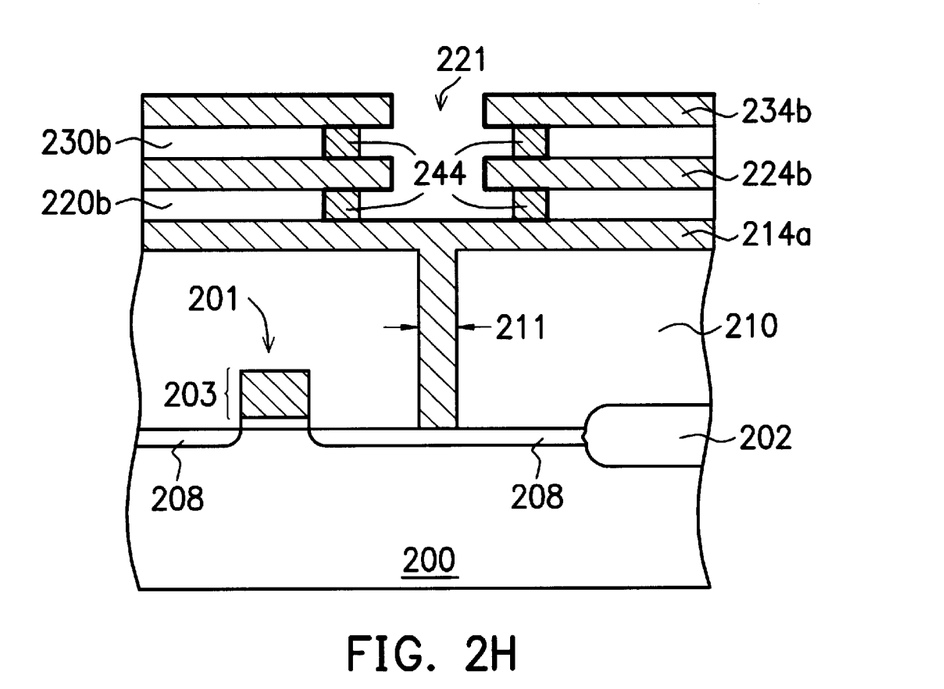

As shown in FIG. 2H, a number of conductive layers 244, called as the third-conductive layer, are formed by depositing into the indented void 231 (seen in FIG. 2G) from the inner surface of the insulating layers 220b, 230b, close to the opening 221. It is formed preferably to include doped polysilicon material by CVD method.

Figure 2I:
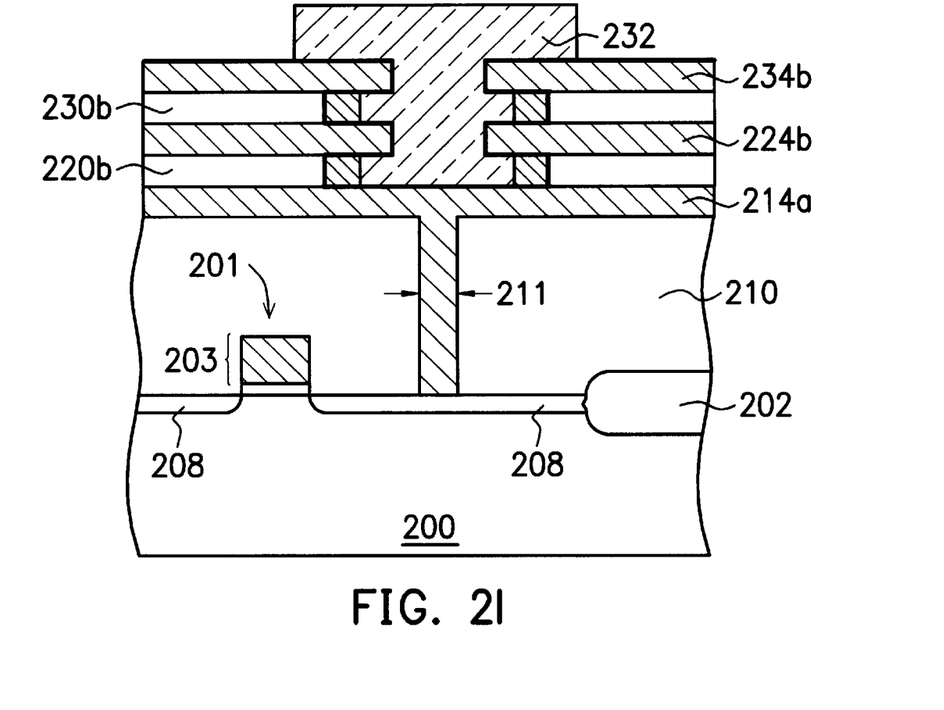
Figure 2J:
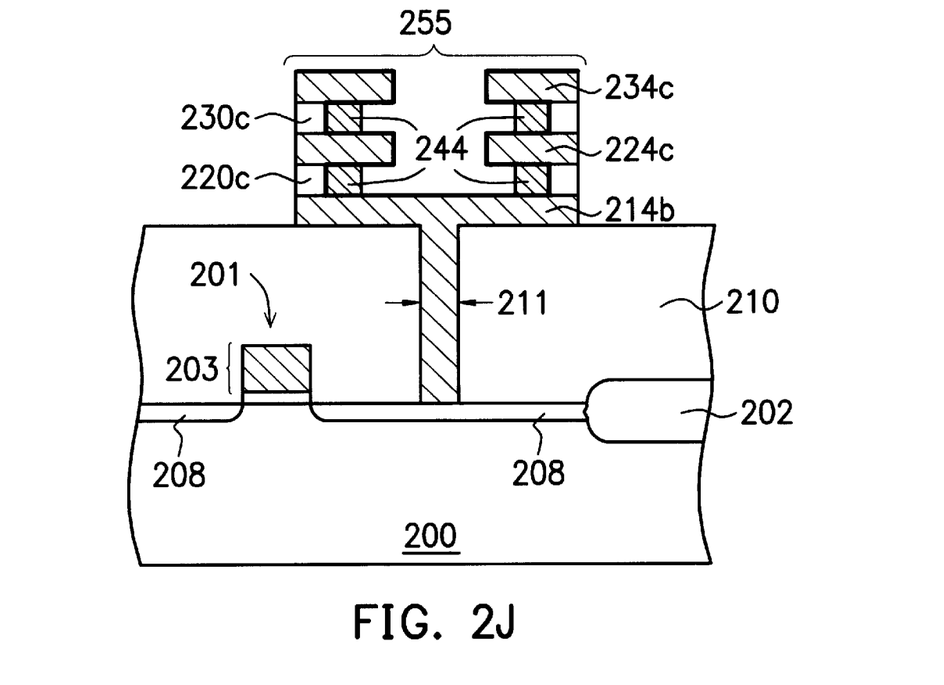

As shown in FIG. 2H and FIG. 2I, a photoresist 232 is filled into the opening 211, where is the a desired capacitor area, and acts as a photo mask. As shown in FIG. 2J, by the technology of photolithography etching, the photoresist 232 is used to define the stacked area 255 and the uncovered portion of the conductive layers of 234b, 224b, 214a and the insulating layers 230b, 220b are etched out. Therefore the stacked area 255 includes a number of conductive layers 234c, 224c, 214b, 244, a number of insulating layers 230c, 220c and a void space at the center originated from the opening 221. The insulating layers 230c, 220c can be removed by a preferred method of isotropic etching including the use of attenuated hydrofluoric acid solution or buffer oxide etchant (BOE).

Figure 2K:
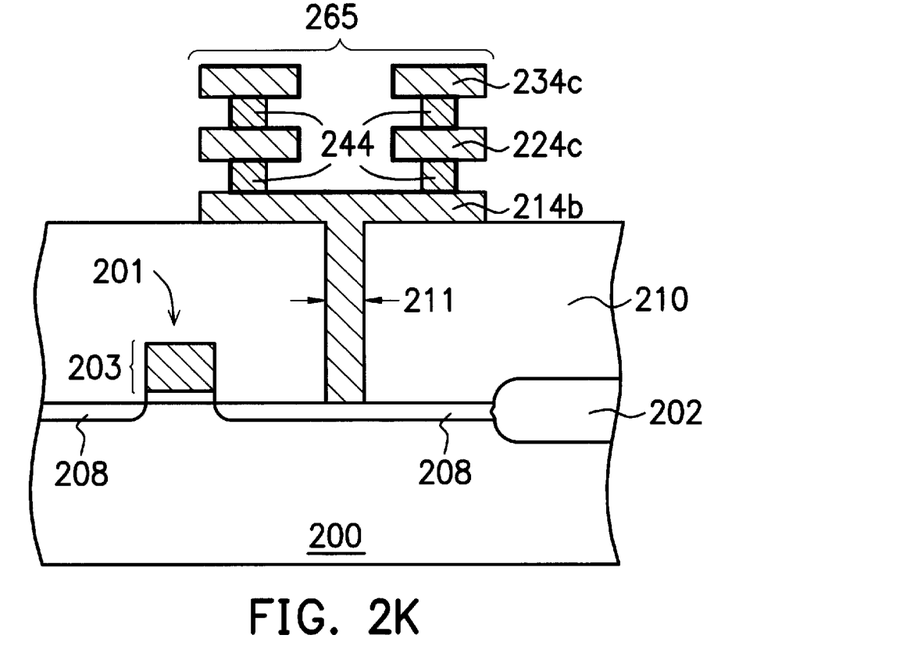

As shown in FIG. 2K, after removing the residual insulating layers as indicated by 230c and 220c (seen in FIG. 2J), a stacked type conductive layer 265 including a number of conductive layers 234c, 224c, 214b, 244 is formed by the method of isotropic etching. The method of isotropic etching has included the use of attenuated hydrofluoric acid solution or BOE to remove the residual insulating layer, which is made of BPSG or TEOS silicon oxide. The stacked type conductive layer 265, which can also be made of polysilicon or other similar conductive materials, is used as the lower electrode of the capacitor. The lower electrode has a horn-like structure in sectional view as composed of three horizontal conductive layers and two vertical conductive layers to become a pair of horns extruding up from the conductive layer 214b.

Figure 2L:
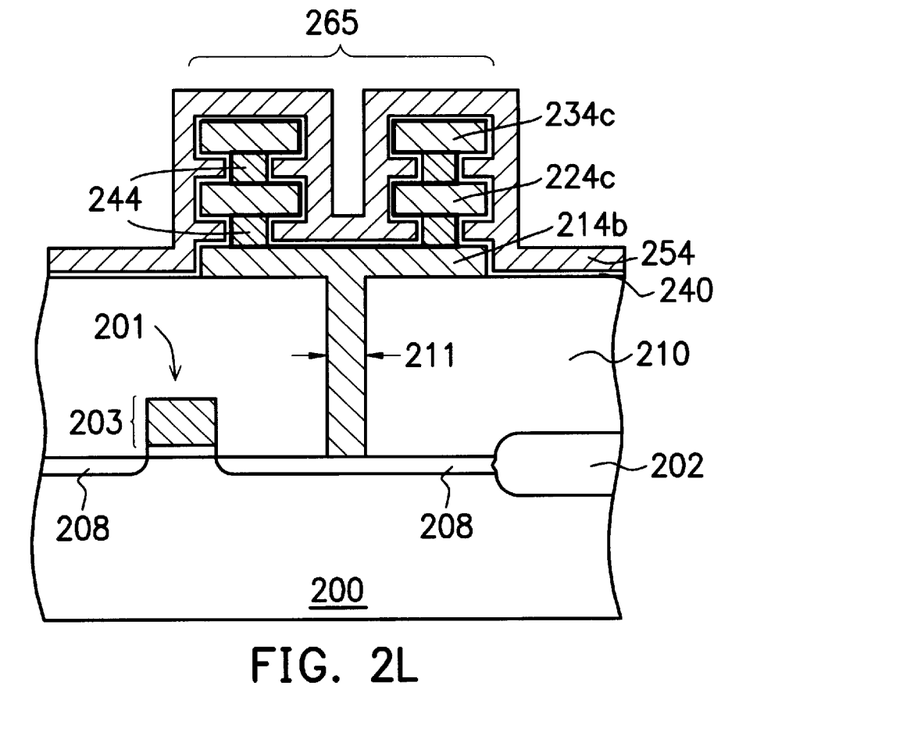

As shown in FIG. 2L, a conformal dielectric thin film 240 with a thickness about between 10 and 60 Angstrom is formed over the stacked type conductive layer 265. The dielectric thin film 240 includes one with high dielectric constant like silicon dioxide, silicon-nitride/silicon-dioxide (NO), silicon-dioxide/nitride/silicon-dioxide (ONO), $Ta_2O_5$, $Pb(Zr,Ti)O_3$ (called PZT), or $(Ba,Sr)TiO3$ (called BST). Then, a conductive layer 254 to act as an upper electrode of the capacitor called as the fourth-conductive layer, is formed over the dielectric thin film 240. The conductive layer 254 is preferred made of one such as a metal layer or a polysilicon layer. The preferred strategy to form the conductive layer 254 is using deposited polysilicon by a method of CVD and doping the dopant such as gallium ion for N type after the CVD deposition to enhance the conductivity. Another preferred strategy is using a metal layer includes, for example, titanium nitride by a depositing process. The capacitor in the DRAM is formed by defining another opening at the center of the conductive layer 254 by the technology of photolithography etching.

The invention can be applied for either capacitor over bit-line (COB) type or capacitor under bit-line (CUB) type used in a DRAM. Even though some conventional fabricating details needed for really completing the production of a DRAM integrated circuit device, such as bonding pad, interconnection, passivation and packaging, are not shown in FIG. 2L these related conventional technologies should have been realized by skilled persons. So, these related conventional technologies are not redundantly described here.

In the preferred embodiment of this present invention, except the dopants of gallium or phosphorus ion, the stacked type conductive layer 265 and the conductive layer 254 can be doped with the other dopants with similar properties. About the method of the doping and the dopants, in addition to the one described above there are three another method as follows: 1. After the polysilicon has been formed, the method of Ion Implantation is applied to obtain the desired concentration and dopant; 2. During the method of CVD being applied to deposit the polysilicon the desired dopant with proper concentration is mixed together into the deposition; 3. After the polysilicon has been done by utilizing the method of CVD for deposition, a procedure of thermal diffusion is applied to obtain the desired dopant with proper concentration.

In conclusion, the invention has characteristics as follows:

1. To obtain the gear-like opening on the lower electrode, it utilizes a number of the insulating layers and the second-conductive layers which are alternatively superposed together have been taken;
2. The horn-like structure of the capacitor in sectional view has significantly increased the efficiency of the use of available area so that the capacitance of the DRAM is accordingly increased either;
3. The fabricating procedure in the invention is compatible with the conventional fabricating procedure. This allows the conventional fabricating procedure to be easily modified.

The invention has been described using exemplary preferred embodiment. However, It is to be understood that the scope of the invention is not limited to the disclosed embodiment. On the contrary, it is intended to cover various modifications and similar arrangements. The scope of the claims, therefore, should be accorded the broadest interpretation so as to encompass all such modifications and similar arrangements.

What is claimed is:

1. A fabricating method of a capacitor of a dynamic random access memory (DRAM), the fabricating method comprising:

forming a field effect transistor on a substrate, wherein the field effect transistor has an interchangeable source/drain region;

forming a dielectric layer over the substrate;

defining the dielectric layer to form a contact window;

forming a first-conductive layer over the substrate to fill in the contact window and to be coupled to the interchangeable source/drain region;

forming a plurality of insulating layers over the first-conductive layer;

forming a plurality of second-conductive layers over the first-conductive layer;

forming a stacked layer over the first-conductive layer, wherein the stacked layer comprises the insulating layers and the second-conductive layers stacked alternatively;

defining the stacked layer to form an opening which exposes the first-conductive layer; wherein a side surface of each of the insulating layers is exposed at a periphery of the opening;

removing a portion of each of the insulating layers from the side surface so that the periphery of the opening has an indented void which is gear-shape in a sectional view of the capacitor;

forming a plurality of third-conductive layers to fill in a portion of the indented void from the periphery of the opening;

defining both the stacked layer and the first-conductive layer to form a stacked area, wherein a rim of the stacked layer and the first-conductive layer are removed so that the stacked area comprises the first-conductive layer, the second-conductive layers, the third-conductive layers and a residual-portion of the insulating layers;

removing the residual-portion of the insulating layers so that the first-conductive layer, the second-conductive layers and the third-conductive layers act together as a lower electrode, which has a horn-like structure in the sectional view of the capacitor;

forming a dielectric thin film covering the lower electrode; and forming a fourth-conductive layer covering the dielectric thin film to act as an upper capacitor plate.

2. The fabricating method of claim 1, wherein the dielectric layer comprises silicon dioxide.

3. The fabricating method of claim 1, wherein the dielectric layer comprises BoronPhosphoSilicate Glass (BPSG).

4. The fabricating method of claim 1, wherein said step of defining the dielectric layer comprises using an anisotropic etching.

5. The fabricating method of claim 1, wherein the first-conductive layer comprises using a method of CVD.

6. The fabricating method of claim 1, wherein the first-conductive layer comprises polysilicon.

7. The fabricating method of claim 1, wherein the insulating layers comprise BPSG.

8. The fabricating method of claim 1, wherein the insulating layer comprise Tetra-Ethyl-Ortho-Silicate (TEOS) silicon oxide.

9. The fabricating method of claim 1, wherein the second-conductive layers comprise a method of CVD.

10. The fabricating method of claim 1, wherein the second-conductive layers comprise polysilicon.

11. The fabricating method of claim 1, wherein the opening in said step of defining the stacked layer is just right above the contact window.

12. The fabricating method of claim 1, wherein said removing the portion of each insulating layers comprises a method of isotropic etching.

13. The fabricating method of claim 12, wherein said step of removing the portion of each of the insulating layers comprises using an attenuated solution of hydrofluoric acid.

14. The fabricating method of claim 12, wherein said step of removing the portion of each of the insulating layers comprises using a solution of buffer oxide etchant.

15. The fabricating method of claim 1, wherein said removing the residual-portion of the insulating layers comprises a method of isotropic etching.

16. The fabricating method of claim 15, wherein said step of removing the residual-portion of the insulating layers comprises using an attenuated solution of hydrofluoric acid.

17. The fabricating method of claim 15, wherein said step of removing the residual-portion of the insulating layers comprises using a solution of buffer oxide etchant.

18. The fabricating method of claim 1, wherein the third-conductive layers comprise a method of CVD.

19. The fabricating method of claim 1, wherein the third-conductive layers comprise polysilicon.

20. The fabricating method of claim 1, wherein the dielectric thin film comprises one of silicon-nitride/silicon-dioxide, silicon-dioxide/silicon-nitride/silicon-dioxide, $Ta_2O_5$, PZT or BST.

21. The fabricating method of claim 1, wherein the fourth-conductive layer comprises a method of CVD.

22. The fabricating method of claim 1, wherein the fourth-conductive layer comprises polysilicon.

* * * * *